(12) United States Patent
Lee

(10) Patent No.: US 8,797,492 B2
(45) Date of Patent: Aug. 5, 2014

(54) FLEXIBLE CIRCUIT BOARD

(75) Inventor: Jae-Han Lee, Hwaseong-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 137 days.

(21) Appl. No.: 13/350,956

(22) Filed: Jan. 16, 2012

(65) Prior Publication Data

US 2013/0021571 A1    Jan. 24, 2013

(30) Foreign Application Priority Data

Jul. 21, 2011    (KR) ........................ 10-2011-0072542

(51) Int. Cl.
*G02F 1/1345*    (2006.01)

(52) U.S. Cl.
USPC ............................. 349/150; 349/149; 349/152

(58) Field of Classification Search
None
See application file for complete search history.

(56) References Cited

U.S. PATENT DOCUMENTS

| | | | |
|---|---|---|---|
| 6,657,606 B2 | 12/2003 | Kang et al. | |
| 2002/0135727 A1 * | 9/2002 | Nakaminami et al. | 349/149 |
| 2005/0233613 A1 | 10/2005 | Naitoh et al. | |
| 2007/0241462 A1 * | 10/2007 | Nakamura et al. | 257/777 |
| 2008/0074830 A1 | 3/2008 | Kurasawa | |

FOREIGN PATENT DOCUMENTS

| | | |
|---|---|---|
| JP | 07-072493 | 3/1995 |
| JP | 2002-040474 | 2/2002 |
| JP | 2005-234335 | 9/2005 |
| JP | 2008-078552 | 4/2008 |
| JP | 2009-302200 | 12/2009 |
| KR | 10-0200351 | 3/1999 |
| KR | 10-0290171 | 2/2001 |
| KR | 10-0332439 | 4/2002 |
| KR | 1020080001511 | 1/2008 |
| KR | 1020090061447 | 6/2009 |

* cited by examiner

*Primary Examiner* — Bumsuk Won
*Assistant Examiner* — Ryan Crockett
(74) *Attorney, Agent, or Firm* — F. Chau & Associates, LLC

(57) ABSTRACT

A flexible circuit board according to an exemplary embodiment of the present invention includes a flexible base film including a liquid crystal panel bonding part at a side, which is bonded with a liquid crystal panel, a driving integrated circuit at a center of the flexible base film, a plurality of first conductive patterns on the flexible base film and extending from the driving integrated circuit to the liquid crystal panel bonding part, a solder resin layer exposing a first portion of the first conductive patterns, which is disposed on the liquid crystal panel bonding part, and covering a second portion of the first conductive patterns, which is a portion of the first conductive patterns other than the first portion, and a solder resin layer extending part protruding from an edge of the solder resin layer in a direction parallel to a direction in which the first conductive patterns extend.

18 Claims, 4 Drawing Sheets

FLEXIBLE CIRCUIT BOARD

CROSS-REFERENCE TO RELATED APPLICATION

This application claims priority to and the benefit of Korean Patent Application No. 10-2011-0072542 filed in the Korean Intellectual Property Office on Jul. 21, 2011, the entire contents of which are herein incorporated by reference.

BACKGROUND (a) Technical Field

The embodiments of the present invention relate to a flexible circuit board.

(b) Discussion of the Related Art

A liquid crystal display panel includes two substrates with field generating electrodes, such as pixel electrodes and a common electrode, and a liquid crystal layer interposed between the two substrates.

The liquid crystal display panel generates electric fields in the liquid crystal layer by applying voltages to the field generating electrodes, determines the alignment of liquid crystal molecules of the liquid crystal layer by the generated electric fields, and controls polarization of incident light, thereby displaying images.

The liquid crystal display panel receives an electric signal to determine whether to transmit light.

The liquid crystal display panel includes a source part including a source driving integrated circuit for applying image data to display an image and a gate part including a gate driving integrated circuit for applying a gate signal to drive a gate element of a thin film transistor of the liquid crystal panel.

An image signal received from the outside is converted into a data signal for driving the liquid crystal display panel and a gate signal for driving the thin film transistor in a printed circuit board. The data signal and the gate signal are applied to the transistor of the liquid crystal display panel through the source part and the gate part, respectively. Accordingly, the liquid crystal panel receives the electric signal to control light from a backlight assembly, thereby displaying images.

A flexible circuit board is used in the liquid crystal display module to connect the source and gate driving integrated circuits disposed between the liquid crystal display panel and the printed circuit board. A chip on film (COF) method is used to mount the driving integrated circuit on the flexible circuit board. Due to the flexibility of the flexible circuit board, edges of the flexible circuit board bonded with the LCD panel may become detached from the LCD panel due to external stress.

SUMMARY

The embodiments of the present invention provide a flexible circuit board strongly bonded with a liquid crystal panel in a module of a display device.

An exemplary embodiment of the present invention provides a flexible circuit board including a flexible base film including a liquid crystal panel bonding part at a side, wherein the liquid crystal panel bonding part is bonded with a liquid crystal panel, a driving integrated circuit at a center of the flexible base film, a plurality of first conductive patterns on the flexible base film extending from the driving integrated circuit to the liquid crystal panel bonding part, a solder resin layer exposing a first portion of the first conductive patterns, wherein the first portion is disposed on the liquid crystal panel bonding part, and covering a second portion of the first conductive patterns, wherein the second portion is a portion of the first conductive patterns other than the first portion, and a solder resin layer extending part protruding from an edge of the solder resin layer in a direction parallel to a direction in which the first conductive patterns extend.

The solder resin layer extending part overlaps an edge of the liquid crystal panel.

The flexible base film includes a pressed portion to which heat and pressure are applied and a non-pressed portion to which no heat and pressure are applied, and the solder resin layer may be disposed at the non-pressed portion and the solder resin layer extending part may be disposed at the pressed portion.

The flexible circuit board further includes an aligning mark at an outer portion of the first conductive patterns on the liquid crystal panel bonding part.

The aligning mark is made of the same material as the first conductive pattern.

The aligning mark is adjacent to an outermost first conductive pattern of the first conductive patterns, and the solder resin layer extending part may protrude toward the aligning mark.

The flexible base film includes a printed circuit board bonding part bonded with a printed circuit board at another side of the flexible base film opposite to the side including the liquid crystal panel bonding part.

The flexible circuit board further includes a plurality of second conductive patterns on the flexible base film extending from the driving integrated circuit to the printed circuit board bonding part.

The solder resin layer cover a first portion of the second conductive patterns and exposing a second portion of the second conductive patterns, wherein the second portion is disposed on the printed circuit board bonding part.

A pitch of the first conductive patterns is about 40 um or less.

According to an embodiment, there is provided a flexible circuit board comprising a base film including first and second bonding parts opposite to each other and a central portion between the bonding parts, a conductive pattern extending on the base film in a first direction, and a solder resin layer on the conductive pattern, wherein the solder resin layer covers the conductive pattern on the central portion and exposes the conductive pattern on the first and second bonding parts, respectively, wherein the solder resin layer includes extensions protruding in the first direction from two opposite ends of a side of the solder resin layer adjacent to the first or second bonding part.

According to the exemplary embodiments of the present invention, it is possible to maximize a bonding effect between a display panel and a flexible circuit board by changing a shape of the solder resin layer but not changing the design of a known display device module.

DETAILED DESCRIPTION OF THE EMBODIMENTS

Figure 1:
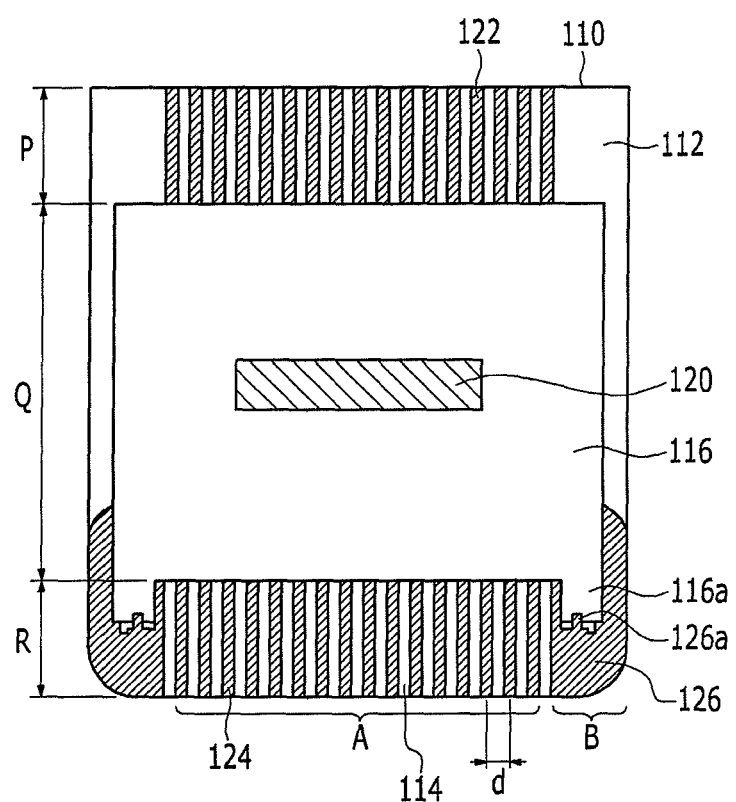
FIG. 1 is a plan view illustrating a flexible circuit board according to an exemplary embodiment of the present invention.

Hereinafter, exemplary embodiments of the present invention will be described in detail with reference to the accompanying drawings.

In the drawings, the thickness of layers, films, panels, regions, etc., may be exaggerated for clarity. It will be understood that when a layer is referred to as being "on" another layer or substrate, it can be directly on the other layer or intervening them may also be present. Like reference numerals may designate like or similar elements throughout the specification and the drawings.

Figure 2:
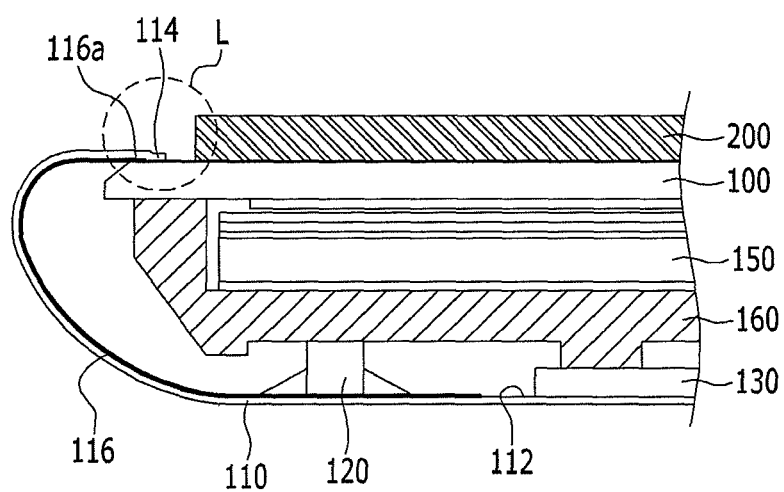
FIG. 2 is a cross-sectional view illustrating the flexible circuit board shown in FIG. 1 mounted on a liquid crystal display module.

FIG. 1 is a plan view illustrating a flexible circuit board according to an exemplary embodiment of the present invention. FIG. 2 is a cross-sectional view illustrating the flexible circuit board shown in FIG. 1 mounted on a liquid crystal display module.

Referring to FIGS. 1 and 2, a flexible base film 110 according to an exemplary embodiment of the present invention includes a printed circuit board bonding part 112 at a first side and a liquid crystal panel bonding part 114 at a second side of the flexible base film 110 opposite to the first side. The printed circuit board bonding part 112 is bonded with a printed circuit board 130. The liquid crystal panel bonding part 114 is bonded with a liquid crystal panel 100.

A driving integrated circuit 120 is mounted at a center of the flexible base film 110 between the printed circuit board bonding part 112 and the liquid crystal panel bonding part 114. The driving integrated circuit 120 receives a driving signal for driving the liquid crystal panel 100 from an outside source (not shown) and transfers the driving signal to each element of the liquid crystal panel 100.

Input side conductive patterns 122, which are also referred to as second conductive patterns, are electrically connected to the printed circuit board 130 and the driving integrated circuit 120. The input side conductive patterns 122 transfer the driving signal to the driving integrated circuit 120 from the printed circuit board 130. The input side conductive patterns 122 are formed on the printed circuit board bonding part 112 and extended to the driving integrated circuit 120. A central portion of the input side conductive patterns 122, which is positioned around the driving integrated circuit 120, is covered by a solder resin layer 116.

Output side conductive patterns 124, which are also referred to as first conductive patterns, are electrically connected to the driving integrated circuit 120 and the liquid crystal panel 100. The output side conductive patterns 124 apply the driving signal to each driving element of the liquid crystal panel 100 from the driving integrated circuit 120. The output side conductive patterns 124 are formed on the liquid crystal panel bonding part 114 and extended to the driving integrated circuit 120. A central portion of the output side conductive patterns 124, which is positioned around the driving integrated circuit 120, is covered by the solder resin layer 116.

Align patterns 126 including aligning marks 126a are formed at two sides of the output side conductive patterns 124 so that the flexible circuit board can be easily connected to wires of the liquid crystal panel 100.

The input side conductive patterns 122 and the output side conductive patterns 124 are made of a metal such as, for example, copper. According to an embodiment, the align patterns 126 may be made of the same material as the conductive patterns 122 and 124. According to an embodiment, the align patterns 126 are formed simultaneously with the conductive patterns 122 and 124.

The solder resin layer 116 is formed between the printed circuit board bonding part 112 and the liquid crystal panel bonding part 114 under the driving integrated circuit 120. In detail, the solder resin layer 116 covers the input side conductive patterns 122 and the output side conductive patterns 124 around the driving integrated circuit 120 and exposes the input side conductive patterns 122 formed on the printed circuit board bonding part 112 and the output side conductive patterns 124 formed on the liquid crystal panel bonding part 114. The solder resin layer 116 is made of, for example, a polyimide-based resin. However, the solder resin layer 116 is formed not to cover the liquid crystal panel bonding part 114.

Referring to FIG. 2, to manufacture a liquid crystal display module, as shown in FIG. 2, a backlight assembly 150 for supplying light is disposed at a mold frame 160. A display unit including the liquid crystal panel 100 is mounted on the backlight assembly 150. An upper panel 200 is disposed at a position opposite to the liquid crystal panel 100. A liquid crystal layer (not shown) is disposed between the liquid crystal panel 100 and the upper panel 200.

The flexible circuit board is bent to be adhered to the bottom of the mold frame 160 while surrounding an outside of a side wall of the mold frame 160.

The input side conductive patterns 122 of the flexible circuit board are connected with an output side of the printed circuit board 130, and the printed circuit board 130 is adhered to the bottom of the mold frame 160.

The flexible circuit board according to an exemplary embodiment includes a solder resin layer extending part 116a which protrudes in a direction parallel to a direction in which the first conductive pattern 124 is extended from an edge of the solder resin layer 116. As shown in FIG. 2, the solder resin layer extending part 116a overlaps and is connected with an edge of the liquid crystal panel 100.

Figure 3:
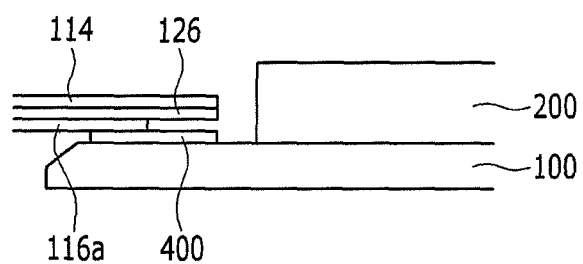
FIG. 3 is an enlarged view of a portion represented by "L" in FIG. 2.
Figure 4:
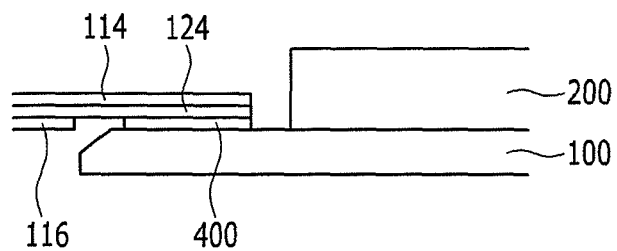
FIG. 4 is an enlarged view of a portion corresponding to the portion "L" of FIG. 2 in a connection portion of a liquid crystal panel bonding part.

The solder resin layer extending part 116a is described in detail with reference to FIGS. 1 to 4. FIG. 3 is an enlarged view of a portion represented by "L" in FIG. 2. FIG. 4 is an enlarged view of a portion corresponding to the portion "L" of FIG. 2 in a connection portion of a liquid crystal panel bonding part.

Referring to FIGS. 1 to 3, the flexible base film 110 includes pressed portions P and R to which heat and pressure are applied and a non-pressed portion Q to which no heat and pressure are applied. The flexible base film 110 includes a connection portion A where a plurality of first conductive patterns 124 are positioned and an align portion B where the align pattern 126 including aligning marks 126a adjacent to the outmost first conductive patterns 124 is positioned.

The solder resin layer 116 is positioned at the non-pressed portion Q, and the solder resin layer extending part 116a is positioned at the pressed portion R. The solder resin layer extending part 116a protrudes toward the align portion B.

Referring to FIGS. 3 and 4, a conductive adhesive layer 400 is formed at an edge of the liquid crystal panel 100. As shown in FIG. 3, the solder resin layer extending part 116a and the edge of the liquid crystal panel 100 overlap each other with the conductive adhesive layer 400 interposed between the solder resin layer extending part 116a and the liquid crystal panel 100. The heat and pressure are applied to the liquid crystal panel bonding part 114 by equipment, such as a tool bar. As shown in FIG. 4, the liquid crystal panel bonding part 114 of the flexible base film 110 and the edge of the liquid crystal panel 100 are adhered to each other at the connection portion A by the conductive adhesive layer 400, and as shown in FIG. 3, the solder resin layer extending part 116*a* is attached to the liquid crystal panel 100.

Accordingly, the flexible circuit board according to the exemplary embodiments can compensate for an adhesive defect generated by external vibration and impact around an interface between the solder resin layer 116 and the liquid crystal panel bonding part 114.

According to an exemplary embodiment, a distance d between adjacent first conductive patterns 124, for example, a pitch may be about 40 um or less. As the flexible circuit board uses a multichannel structure, such as 966 or more channels, the pitch is decreased to about 40 um. In the case of including fewer channels, adhesive strength between the flexible circuit board and the liquid crystal panel may be enhanced by decreasing the pitch and forming a dummy space at the edge. However, there is a limit to decreasing the pitch. According to the exemplary embodiments, the adhesive strength can be reinforced by the solder resin layer extending part that protrudes toward the liquid crystal panel bonding part, thus eliminating the need to decrease the pitch or to change the design of the existing normalized base film or the conductive pattern.

As shown in FIG. 4, the solder resin layer 116 does not cover the connection portion A. A step might occur between the first conductive pattern 124 and the solder resin layer 116 on the conductive adhesive layer 400 if the connection portion A were covered by the solder resin layer 116 as shown in FIG. 3, thus rendering it difficult to explode a conductive ball included in the conductive adhesive layer 400 by applying a pressure to the first conductive pattern 124. Accordingly, it is difficult to electrically connect the first conductive pattern 124 with the element of the liquid crystal panel 100, and the adhesive strength between the flexible circuit board and the liquid crystal panel 100 may be deteriorated.

Figure 5:
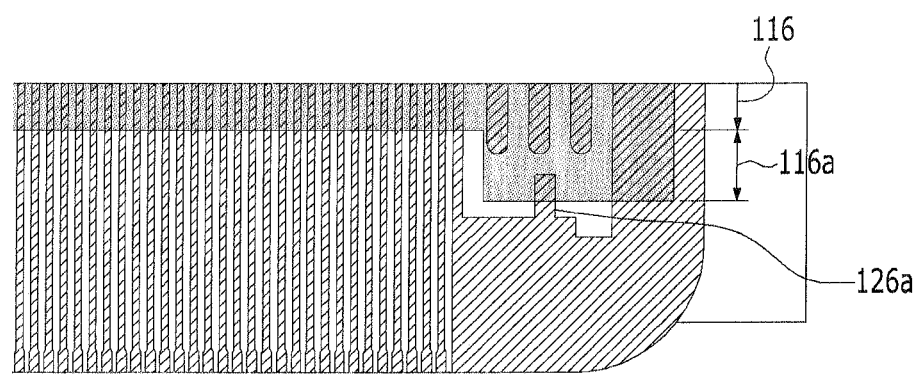
FIG. 5 is a view illustrating a side portion of a flexible circuit board according to an exemplary embodiment of the present invention.

FIG. 5 is a view illustrating a side part of a flexible circuit board according to an exemplary embodiment of the present invention.

Referring to FIG. 5, the solder resin layer extending part 116*a* protrudes from the edge of the solder resin layer 116 to the align pattern 126. The solder resin layer extending part 116*a* protrudes beyond a portion of the aligning mark 126*a*.

According to the exemplary embodiments, reinforcing the adhesive strength between the liquid crystal panel and the flexible base film has been described. However, the embodiments of the present invention are not limited thereto. According to an embodiment, the embodiments also apply to reinforcing the adhesive strength between the printed circuit board and the flexible base film. For example, according to an embodiment, the solder resin layer extending part protruding in a direction parallel to a direction in which the second conductive pattern extends at the edge of the solder resin layer is formed. The solder resin layer extending part overlaps the edge of the printed circuit board and is positioned at the non-pressed portion P of FIG. 1.

While the embodiments of the invention have been described, it is to be understood that the embodiments of the invention are not limited thereto, but, on the contrary, are intended to cover various modifications and equivalent arrangements included within the spirit and scope of the appended claims.

What is claimed is:

1. A flexible circuit board comprising:
   a flexible base film including a liquid crystal panel bonding part at a side, wherein the liquid crystal panel bonding part is bonded with a liquid crystal panel;
   a driving integrated circuit at a center of the flexible base film;
   a plurality of first conductive patterns on the flexible base film and extending from the driving integrated circuit to the liquid crystal panel bonding part;
   a solder resin layer exposing a first portion of the first conductive patterns, wherein the first portion is disposed on the liquid crystal panel bonding part, and covering a second portion of the first conductive patterns; and
   a solder resin layer extending part protruding from an edge of the solder resin layer in a direction parallel to a direction in which the first conductive patterns extend, wherein the solder resin layer extending part is attached to an edge of the liquid crystal panel, and wherein the solder resin layer is apart from the edge of the liquid crystal panel, wherein the solder resin layer extending part does not cover the first conductive patterns.

2. The flexible circuit board of claim 1, wherein the solder resin layer extending part overlaps an edge of the liquid crystal panel.

3. The flexible circuit board of claim 2, wherein the flexible base film comprises a pressed portion to which heat and pressure are applied and a non-pressed portion to which no heat and pressure are applied, and wherein the solder resin layer is disposed at the non-pressed portion, and the solder resin layer extending part is disposed at the pressed portion.

4. The flexible circuit board of claim 3, further comprising:
   an aligning mark at an outer portion of the first conductive patterns on the liquid crystal panel bonding part.

5. The flexible circuit board of claim 4, wherein the aligning mark is made of the same material as the first conductive patterns.

6. The flexible circuit board of claim 5, wherein the aligning mark is adjacent to an outermost first conductive pattern of the first conductive patterns, and the solder resin layer extending part protrudes toward the aligning mark.

7. The flexible circuit board of claim 1, wherein the flexible base film comprises a printed circuit board bonding part bonded with a printed circuit board at another side of the flexible base film opposite to the side including the liquid crystal panel bonding part.

8. The flexible circuit board of claim 7, further comprising:
   a plurality of second conductive patterns on the flexible base film extending from the driving integrated circuit to the printed circuit board bonding part.

9. The flexible circuit board of claim 8, wherein the solder resin layer covers a first portion of the second conductive patterns and exposing a second portion of the second conductive patterns, wherein the second portion is disposed on the printed circuit board bonding part.

10. The flexible circuit board of claim 1, wherein a pitch of the first conductive patterns is about 40 um or less.

11. The flexible circuit board of claim 1, wherein the flexible base film comprises a pressed portion to which heat and pressure are applied and a non-pressed portion to which no heat and pressure are applied, and wherein the solder resin layer is disposed at the non-pressed portion, and the solder resin layer extending part is disposed at the pressed portion.

12. The flexible circuit board of claim 11, further comprising:
   an aligning mark at an outer portion of the first conductive patterns on the liquid crystal panel bonding part.

13. The flexible circuit board of claim 12, wherein the aligning mark is adjacent to an outermost first conductive pattern of the first conductive patterns, and the solder resin layer extending part protrudes toward the aligning mark.

14. The flexible circuit board of claim 13, wherein a pitch of the first conductive patterns is about 40 um or less.

15. The flexible circuit board of claim 1, further comprising:
   an aligning mark at an outermost first conductive pattern of the first conductive patterns on the liquid crystal panel bonding part.

16. The flexible circuit board of claim 15, wherein the aligning mark is made of the same material as the first conductive pattern.

17. The flexible circuit board of claim 16, wherein the aligning mark is adjacent to an outermost first conductive pattern of the first conductive patterns, and the solder resin layer extending part protrudes toward the aligning mark.

18. A flexible circuit board comprising:
   a base film including first and second bonding parts opposite to each other and a central portion between the bonding parts;
   a conductive pattern extending on the base film in a first direction; and
   a solder resin layer on the conductive pattern, wherein the solder resin layer covers a first portion of the conductive pattern and exposes a second portion of the conductive pattern, wherein the solder resin layer includes two extensions separated from each other and protruding from an edge of the solder resin layer in the first direction, wherein the two separated extensions do not cover the conductive pattern.

\* \* \* \* \*